United States Patent
Van Der Schaar et al.

(10) Patent No.: US 12,242,203 B2
(45) Date of Patent: Mar. 4, 2025

(54) TARGET FOR MEASURING A PARAMETER OF A LITHOGRAPHIC PROCESS

(71) Applicant: ASML Netherlands B.V., Veldhoven (NL)

(72) Inventors: Maurits Van Der Schaar, Eindhoven (NL); Patrick Warnaar, Tilburg (NL); Franciscus Godefridus Casper Bijnen, Valkenswaard (NL); Olger Victor Zwier, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 100 days.

(21) Appl. No.: 18/001,255

(22) PCT Filed: Jun. 8, 2021

(86) PCT No.: PCT/EP2021/065351
§ 371 (c)(1),
(2) Date: Dec. 8, 2022

(87) PCT Pub. No.: WO2021/250034
PCT Pub. Date: Dec. 16, 2021

(65) Prior Publication Data
US 2023/0236515 A1 Jul. 27, 2023

Related U.S. Application Data

(60) Provisional application No. 63/036,671, filed on Jun. 9, 2020.

(51) Int. Cl.
*G03F 7/00* (2006.01)

(52) U.S. Cl.
CPC ...... *G03F 7/70683* (2013.01); *G03F 7/70633* (2013.01)

(58) Field of Classification Search
CPC . G03F 7/70683; G03F 7/70633; G03F 9/7076
See application file for complete search history.

(56) References Cited

U.S. PATENT DOCUMENTS

| | | | |
|---|---|---|---|
| 5,654,553 | A | 8/1997 | Kawakubo et al. |
| 6,876,946 | B2 | 4/2005 | Yasuda et al. |
| 10,915,017 | B2 * | 2/2021 | Lee ..................... G03F 7/70633 |

(Continued)

FOREIGN PATENT DOCUMENTS

| WO | WO 2009/078708 A1 | 6/2009 |
|---|---|---|
| WO | WO 2009/106279 A1 | 9/2009 |

OTHER PUBLICATIONS

International Search Report and Written Opinion of the International Searching Authority directed to International Patent Application No. PCT/EP2021/065351, mailed Sep. 30, 2021; 10 pages.

(Continued)

*Primary Examiner* — Hung V Nguyen
(74) *Attorney, Agent, or Firm* — Sterne, Kessler, Goldstein & Fox P.L.L.C.

(57) ABSTRACT

Disclosed is target arrangement comprising a first target region having at least a first pitch and at least a second pitch a second target region having at least a third pitch, wherein a portion of the first target region having a second pitch overlaps with a portion of the second target region.

11 Claims, 4 Drawing Sheets

(56) References Cited

U.S. PATENT DOCUMENTS

| | | | |
|---|---|---|---|
| 11,748,869 B1* | 9/2023 | Weiss | G03F 1/44 |
| | | | 356/498 |
| 11,852,981 B2* | 12/2023 | Hsieh | H01L 22/12 |
| 2009/0040536 A1 | 2/2009 | Chiu et al. | |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0242970 A1 | 9/2012 | Smilde et al. | |
| 2016/0179017 A1 | 6/2016 | Yohanan et al. | |
| 2019/0101835 A1* | 4/2019 | Chen | G03F 7/70683 |

OTHER PUBLICATIONS

International Preliminary Report on Patentability directed to International Patent Application No. PCT/EP2021/065351, issued Dec. 13, 2022; 8 pages.

\* cited by examiner

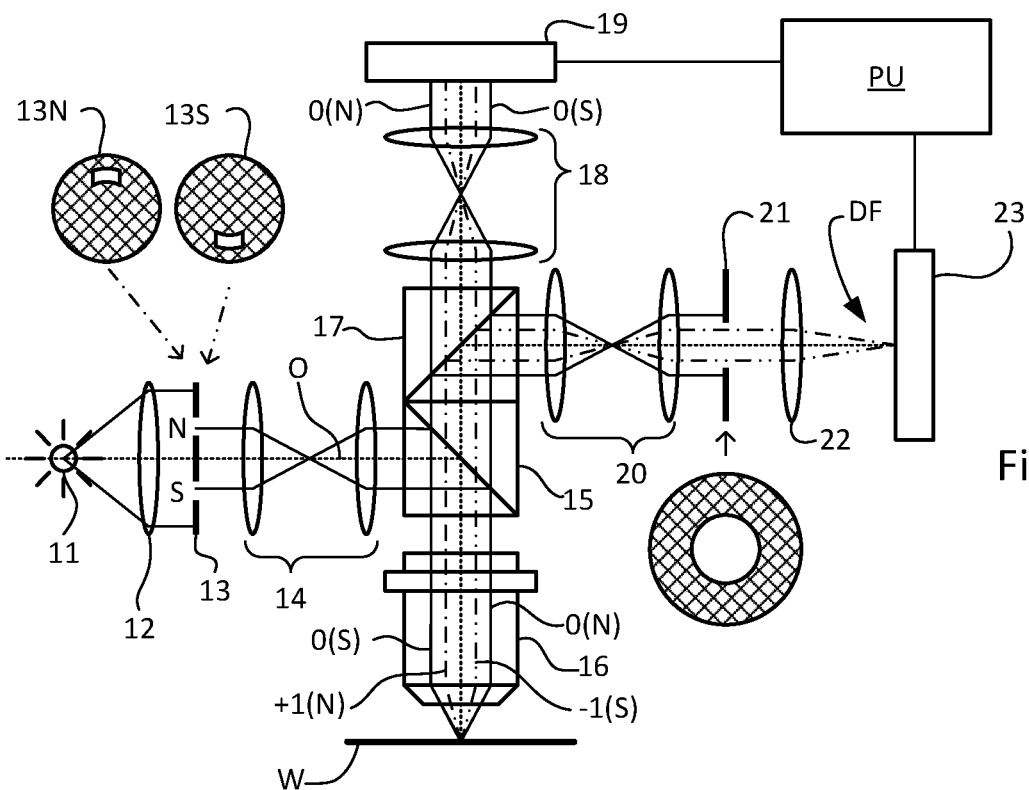
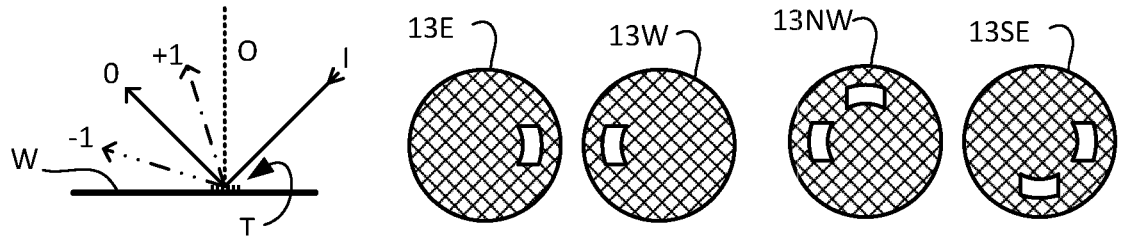
Fig. 3(b)　　　Fig. 3(c)　　　Fig. 3(d)
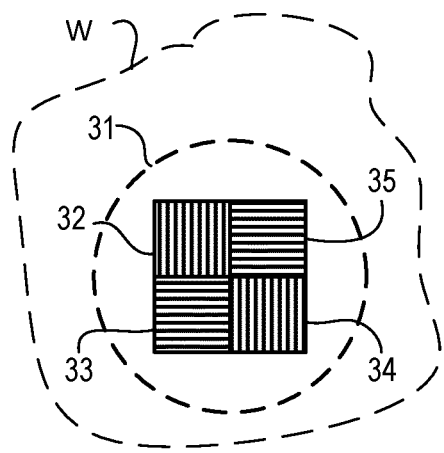
Fig. 4 (prior art)
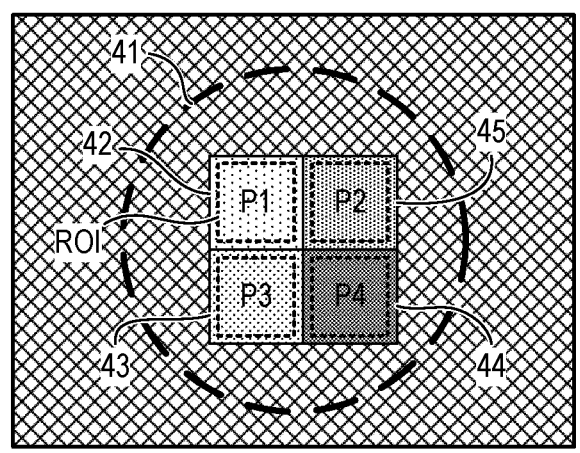
Fig. 5 (prior art)

TARGET FOR MEASURING A PARAMETER OF A LITHOGRAPHIC PROCESS

CROSS-REFERENCE TO RELATED APPLICATIONS

This application claims priority of U.S. application 63/036,671 which was filed on Jun. 9, 2020 and which is incorporated herein in its entirety by reference.

BACKGROUND

Field of the Invention

The present invention relates to a target arrangement for metrology of a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. Modifications of the apparatus to improve throughput are described in US2010201963A1 and US2011102753A1. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the −1st and the +1st diffraction order intensities. The intensity asymmetry, a comparison of these diffraction order intensities, for a given overlay target provides a measurement of asymmetry in the target. This asymmetry in the overlay target can be used as an indicator of overlay (undesired misalignment of two layers).

In another known metrology technique, alignment measurement results are obtained by measuring the scattered radiation, while scanning an alignment target, as disclosed for example in US56545553, incorporated herein by reference in its entirety. An alignment target is disclosed in U.S. Pat. No. 6,876,946, incorporated herein by reference in its entirety.

It became apparent that, in view of stringent requirements for the real-estate on the wafer, the size and/or placement of the metrology targets, overlay and/or alignment, needs to be carefully considered. As the lithographic process may suffer from un-expected variations, it is also known that the position on the wafer of metrology targets, for alignment and/or overlay, may also have variations, which may impact negatively the measured parameters of interest.

SUMMARY OF THE INVENTION

It would be desirable therefore to have available a target arrangement suitable to provide a parameter of interest from alignment and/or overlay metrology.

The invention in a first aspect provides a target arrangement comprising a first target region having at least a first pitch and at least a second pitch a second target region having at least a third pitch, wherein a portion of the first target region having a second pitch overlaps with a portion of the second target region.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprise 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

DETAILED DESCRIPTION OF EXEMPLARY EMBODIMENTS

Before describing embodiments of the invention in detail, it is instructive to present an example environment in which embodiments of the present invention may be implemented.

Figure 1:
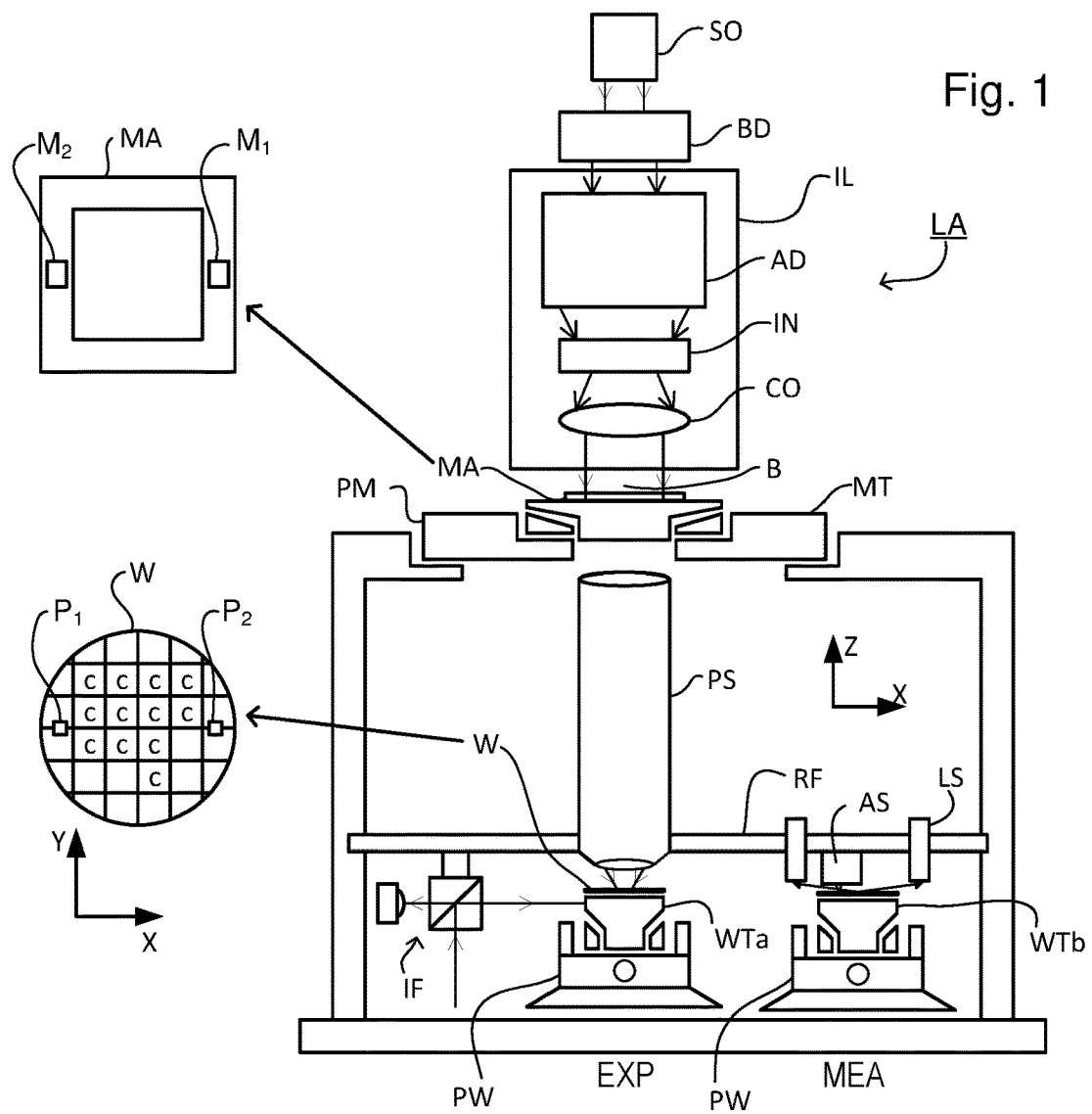
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
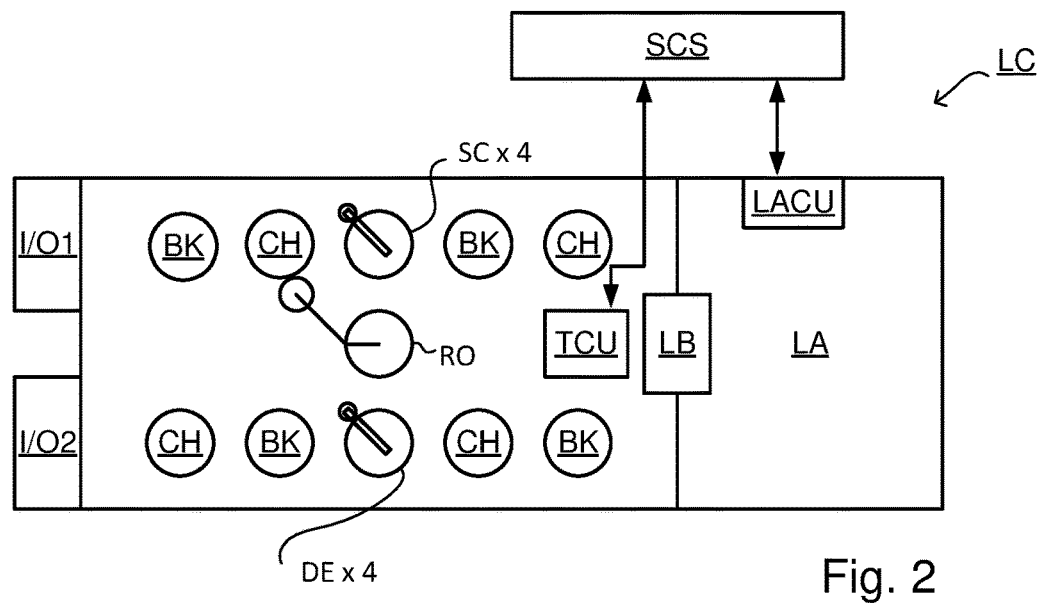
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4 F arrangement. A different lens arrangement can be used, provided that it still provides a substrate image onto a detector, and simultaneously allows for access of an intermediate pupil-plane for spatial-frequency filtering.

Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south(S). When the incident ray I of measurement radiation is from the north side of the optical axis, that is when the first illumination mode is applied using aperture plate 13N, the +1 diffracted rays, which are labeled +1 (N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, 2nd, 3rd and higher order beams (not shown in FIG. 3) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semiconductor device formed on substrate W. Sub-targets 32 to 35 may have differently biased overlay offsets in order to facilitate measurement of overlay between the layers in which the different parts of the composite sub-targets are formed. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Using for example the method described in applications such as US20110027704A, mentioned above, overlay error (i.e., undesired and unintentional overlay misalignment) between the two layers within the sub-targets 32 to 35 is measured. Such a method may be referred to as micro diffraction based overlay (μDBO). This measurement may be done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry.

In a known method using a multi-grating target such as that illustrated in FIG. 4, with overlay OV can be determined via the following equation:

$$OV = \frac{p}{2\pi}\tan^{-1}\left(\tan\left(\frac{2\pi d}{p}\right)\left(\frac{(I_{+d}^{+1} - I_{+d}^{-1}) + (I_{-d}^{+1} - I_{-d}^{-1})}{(I_{+d}^{+1} - I_{+d}^{-1}) - (I_{-d}^{+1} - I_{-d}^{-1})}\right)\right) \cong d\frac{A_{+d} + A_{-d}}{A_{+d} - A_{-d}} \quad \text{(Equation 1)}$$

where:
- $I_{+d}^{+1}$ is the $+1^{st}$ diffraction order from positive bias target (e.g., intensity value);
- $I_{+d}^{-1}$ is the $-1^{st}$ diffraction order from positive bias target;
- $I_{-d}^{+1}$ is the $+1^{st}$ diffraction order from negative bias target;
- $I_{-d}^{-1}$ is the $-1^{st}$ diffraction order from negative bias target;
- $A_{+d} = I_{+d}^{+1} - I_{+d}^{-1}$; (e.g., asymmetry in the $+1^{st}$ and $-1^{st}$ intensities from positive bias target); and
- $A_{-d} = I_{-d}^{+1} - I_{-d}^{-1}$, (e.g., asymmetry in the $+1^{st}$ and $-1^{st}$ intensities from negative bias target).

Equation 1 can be reformulated in terms of a sensitivity coefficient K which is a stack dependent parameter having the special property of being overlay independent (assuming a perfect target):

$$A_{+d} + A_{-d} = K \cdot OV \quad \text{(Equation 2)}$$

where:

$$K = \frac{A_{+d} - A_{-d}}{d} \quad \text{(Equation 3)}$$

Equation 2 is a simple linear equation, based on an assumption of small bias values and overlay errors, compared with a pitch of the gratings that form the sub-targets. However, the dependence of asymmetry on overlay error and bias over a wider range has a substantially sinusoidal form and a sinusoidal model can also be used, instead of the linear model of Equation 2.

The known method using four distinct sub-targets requires borders around each sub-target (not shown in FIGS. 4 and 5) to make them distinctive in the image 40. This means that a certain portion of the patterned area is not usable due to edge effects. Additionally, the use of only two specific offsets enforces the above assumption of linearity, which may lead to inaccuracy when the true relationship is non-linear.

In addition to targets suitable to measure overlay between two semiconductor processed layers, the alignment of the wafer is also known to provide useful information for the lithographic process. As known for the state of the art, the alignment targets may be larger in size than overlay targets.

A common problem for the metrology of a semiconductor process is that metrology targets, either for alignment purposes or for overlay purposes, are aversively affected by variations in the processing conditions. In addition, reducing the size of the space occupied by said metrology specific targets is a continuous aim for metrology of lithographic processes.

Disclosed herein is a target arrangement comprising a first target region having at least a first pitch and at least a second pitch, a second target region having at least a third pitch, wherein a portion of the first target region having a second pitch overlaps with a portion of the second target region. In an embodiment, the first target region is part of an alignment target having a pitch in a first direction and another pitch in a second direction. In an embodiment the two directions are perpendicular. In a further embodiment, the second target region is part of a metrology target suitable for measurement of overlay, focus, dose, or physical parameters of the device structures present on the lithographic wafer, such as tilt, side wall angles and/or critical dimension. The third pitch is the pitch of a portion of the metrology target suitable for measurement of overlay, focus, dose, or physical parameters of the device structures present on the lithographic wafer, such as tilt, side wall angles, critical dimension. In an embodiment, a portion of the alignment target having a second pitch overlaps with the metrology target suitable for the measurement of overlay, focus, dose, or physical parameters of the device structures present on the lithographic wafer, such as tilt, side wall angles, critical dimension. In an embodiment, the first pitch of the alignment target is such that alignment metrology is possible, according to the state of the art.

Figure 6:
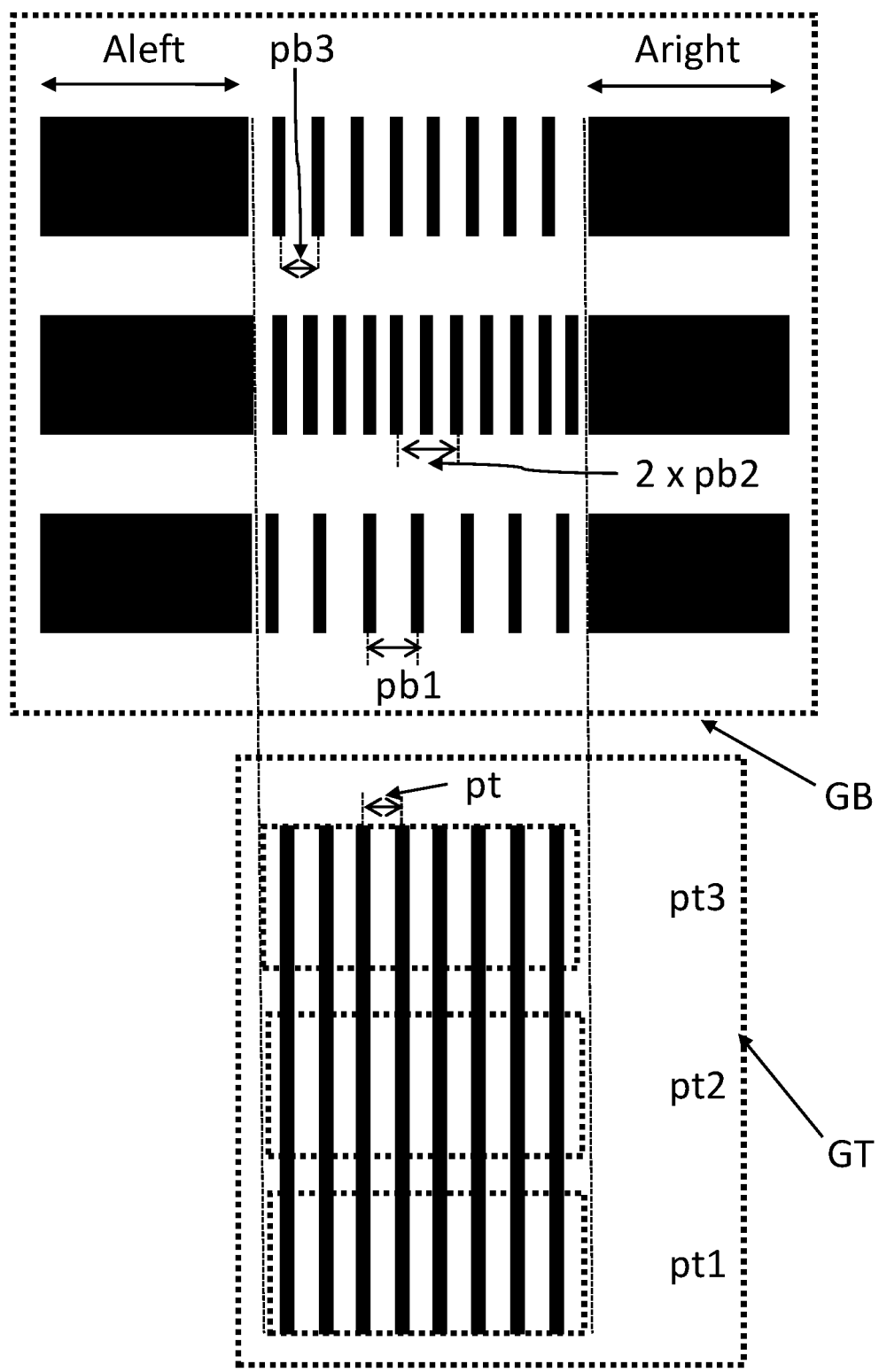
FIG. 6 depicts examples of target arrangements according to embodiments of the invention.

FIG. 6 describes a portion of the target arrangement. The target arrangement is formed by a first arrangement situated in a first layer and a second target arrangement situated in the second layer. In an embodiment, the first target arrangement is a top grating (GT) and the second target arrangement is a bottom grating (GB). The grating GT comprises gratings with pitch pt, as depicted in FIG. 6, which is the third pitch in the second target region of the target arrangement. These gratings may have a single pitch pt. In an embodiment, the gratings forming arrangement GT may have portions with different pitches, pt1, pt2, pt3, as depicted in FIG. 6. Arrangement GT may be in a first layer. Arrangement GB may be in a second layer. On the wafer, arrangement GT may overlay arrangement GB.

FIG. 6 further describes a portion of the target arrangement which is a bottom grating GB. It comprises a middle region formed by gratings having pitches pb1, pb2 or pb3. In an embodiment, regions having pitch pt1 are overlayed with regions having pitch pb1. In an embodiment, regions having the pitches pb1, pb2, pb3 are overlayed with a region a singular pitch, pt. In a further embodiment, the arrangement GB comprises structures defined the dimension Aleft and Aright. With reference to the structures depicted in FIG. 6 in arrangement GB, and only as way of an example, the structures defined by Aleft and Aright may form a grating with a pitch in a direction perpendicular to the pitch pb1, pb2 or pb3, which is a pitch suitable to allow measurements of alignment information, as described in the state of the art.

In an embodiment, a use of the target arrangement as described in FIG. 6 may be as follows: the arrangement GT overlaps the middle section of GB defined by pitches pb1, pb2 and pb3. In an embodiment, pb1, pb2 and pb3 may be the same. In an embodiment, the arrangement GT comprises a single pitch, pt. In an embodiment, pt, pb1, pb2, pb2 are the same pitch. In an embodiment, pb3 is the same pitch as pb1. Pb2 is the same as pt1, and pb1 is the same pitch as pt2. When measured with a metrology tool (which provides illumination radiation and means to detect radiation reflected from said target arrangement formed by overlapping GT and GB), information about overlay, focus, dose, or physical parameters of the device structures present on the lithographic wafer, such as tilt, side wall angles, critical dimension may be extracted using methods known in the state of the art. The metrology tool may be a Diffraction Based Overlay metrology tool (DBO) or an Image Based Metrology tool (IBO). Furthermore, when the region GB in its entirety or only a portion of it, is measured with a metrology tool suitable for alignment metrology (metrology as known in the state of the art), alignment related metrology parameters may be extracted. It is thus an advantage of the current target arrangement in its entirety to provide both metrology information about the position of the wafer (as supplied from the alignment related metrology process) and/or information about the relative alignment between two or more layers in the metrology process (as supplied from the overlay or related parameters metrology process). Alignment and Overlay or related parameters are metrology process as known from the state of the art.

Figure 7A:
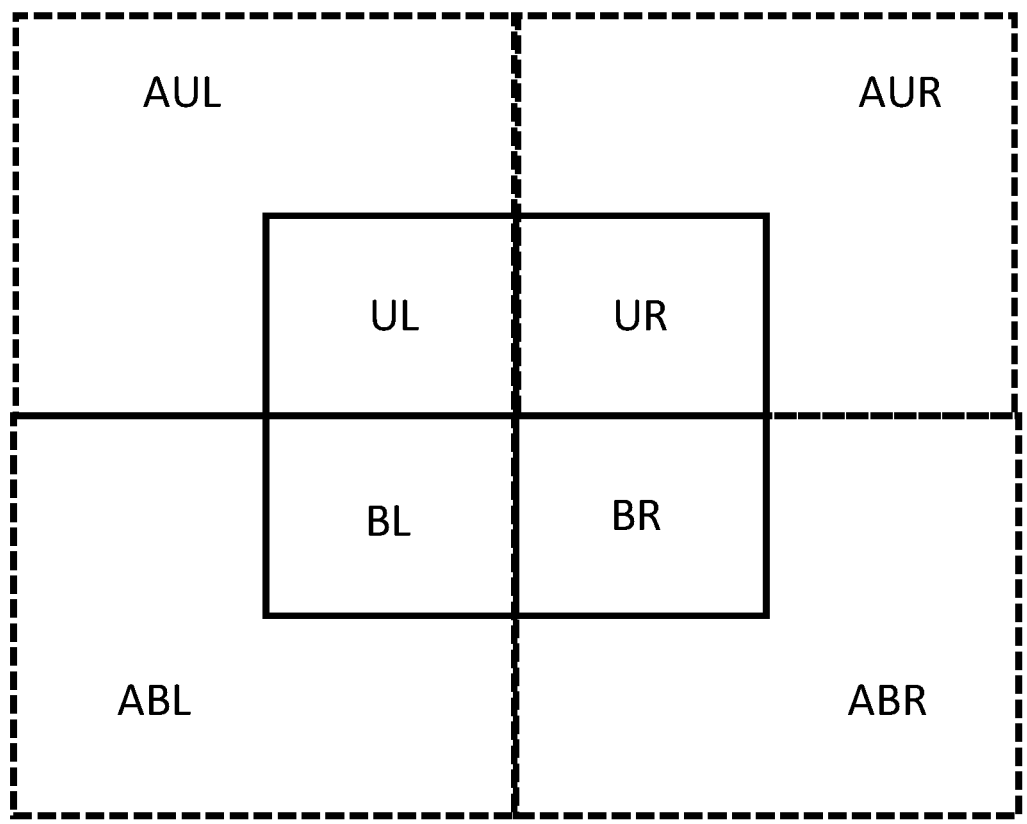
FIG. 7(a) depicts a target arrangement and FIG. 7(b) depicts an image obtained from a portion of the target arrangement depicted in FIG. 7(a).
Figure 7B:
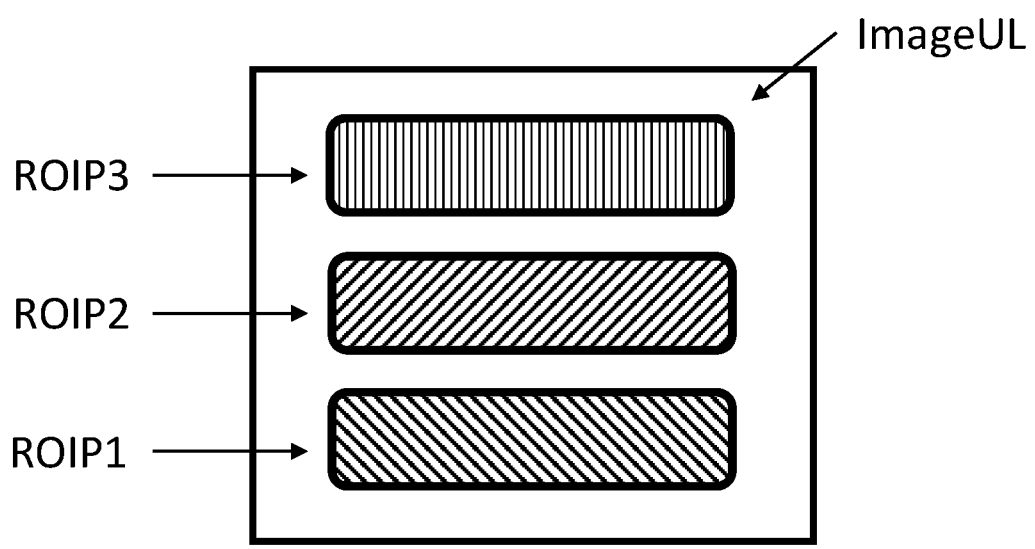

FIG. 7 further depicts a target arrangement in FIG. 7 a) and an image obtained for a portion of the target arrangement of FIG. 7 a). Regions AUL, AUR, ABL and ABR are target arrangements found in a so called bottom layer, the layer comprising structures of arrangement GB of FIG. 6. Regions UL, UR, BL and BR are target arrangements found in so called top layer, the layer comprising structures of arrangement GT of FIG. 6. There is an overlap between regions AUL, AUR, ABL, ABR with regions UL, UR, BL, BR. In an example, region AUL overlaps with region UL, region AUR overlaps with region UR, region ABL overlaps with BL and region BR overlaps with ABR. Regions AUL, AUR, ABL and ABR may be used for alignment metrology. The overlapping parts, as described above, may be used for both alignment and overlay, focus, dose or other physical parameters of the gratings, as understood in prior art as possible with a DBO or IBO metrology tool.

FIG. 7 b) describes an image formed on a detector of a DBO or IBO metrology tool.

The image, ImageUL, is formed by irradiating with illumination radiation at least region UL, which overlaps with a portion of region AUL, and detection the scattered radiation. The gratings forming regions UL and AUL are the arrangements of FIG. 6, in an example. For metrology applications, the metrology tool, either alignment or DBO or IBO based metrology tools, may comprise a software in a computer carrier, which may identify regions of interest related to the overlaps between the gratings of GB and GT arrangements. In an embodiment, ROIP3 is formed by the overlap between pb3 and pt gratings, ROIP2 is formed by the overlap between pb2 and pt gratings, ROIP1 is formed by the overlap between pb1 and pt gratings.

In a further embodiment of the invention, the pitch of a target region may be continuous, that is the distance between the center of gravity of each grating varies in a fashion described by a function. In an embodiment the function may be a sine or a cos ne function. The advantage of having a continuous variation of the pitch in the regions of a metrology target or an alignment target is that the aversively effects due to the edges of the target regions, where a discontinuity in pitch exists, are minimized. In an embodiment, with reference to FIG. 7(a), the alignment pitch of region AUL may vary in a continuous manner toward the metrology pitch of region UL. In an embodiment, the continuous variation of the pitches may be governed by a 2D function, that is to be described by variations in the x or y directions.

It can be appreciated that all the specific arrangements shown are purely examples and there is a near infinite number of possible target arrangements which fall within the scope of the present disclosure. For example, a target arrangement may only comprise target regions for measuring in only a single direction. Also spacing can be added between the pads to counter crosstalk and/or parallax issues. The target arrangements illustrated have been those designed for measurement of overlay. However the concepts herein are also applicable to target arrangements designed for measurement of another parameter of interest. For example, a focus arrangement (e.g., formed with regions having a focus sensitive asymmetry) can also benefit, as the focus dependent asymmetry will also change sign in the measurements and therefore be decoupled from the metrology tool-dependent distortion offsets.

In association with the physical grating structures of the targets realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps necessary to calculate the overlay error.

The program may optionally be arranged to control the optical system, substrate support and the like to perform the steps necessary to calculate the overlay error for measurement of asymmetry on a suitable plurality of targets.

Therefore, disclosed is a target arrangement suitable for metrology of a lithographic process comprising at least two targets positioned within the target arrangement such that the target arrangement has a symmetry upon rotation. The at least two targets may be positioned within the target arrangement such that a measured property of the at least two target has a symmetry upon rotation. Also disclosed is a method to measure a parameter of a lithographic process comprising measuring at least two targets of a metrology target arrangement by illuminating the targets with radiation and detecting the radiation scattered by the targets and determining a property in the measurement of the targets wherein the property has a symmetry upon rotation.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), A well A particle beams, such A ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A target arrangement comprising:
   left and right regions and a first target region in a middle of the left and right regions, the first target region comprising at least first and second portions comprising respective first and second pitches; and
   a second target region comprising at least a third pitch;
   wherein the second portion overlaps with a portion of the second target region.

2. The target arrangement of claim 1, wherein the first pitch and the second pitch of the first target region are in perpendicular directions.

3. The target arrangement of claim 1, wherein the second target region is configured for metrology measurements of overlay, focus, dose, physical parameters of lithographic devices present on a wafer, tilt, side wall angles and/or critical dimensions.

4. The target arrangement of claim 1, wherein the first target region is suitable for alignment metrology.

5. The target arrangement of claim 1, wherein the second target region has a plurality of regions each comprising different pitches.

6. The target arrangement of claim 5, wherein the second target region comprises overlapping regions.

7. The target arrangement of claim 6, wherein the overlapping regions have different pitches.

8. The target arrangement of claim 6, wherein the overlapping regions have a same pitch.

9. The target arrangement of claim 1, wherein pitch variation is described by a continuous function.

10. The target arrangement of claim 1, wherein:
    the left, right, and first target regions are on a first grating,
    the second target region is on a second grating, and
    the first and second gratings are spaced apart from and overlapping each other.

11. The target arrangement of claim 10, wherein the first and second gratings are on first and second layers of a substrate or wafer.

* * * * *

UNITED STATES PATENT AND TRADEMARK OFFICE
CERTIFICATE OF CORRECTION

PATENT NO. : 12,242,203 B2
APPLICATION NO. : 18/001255
DATED : March 4, 2025
INVENTOR(S) : Van Der Schaar et al.

It is certified that error appears in the above-identified patent and that said Letters Patent is hereby corrected as shown below:

In the Specification

In Column 6, Line 64, delete "4 F" and replace with --4F--.

In Column 7, Line 53, delete "+1 (N)," and replace with --+1(N),--.

In Column 12, Line 23, delete "cos ne" and replace with --cosine--.

Signed and Sealed this
Eighth Day of April, 2025

Coke Morgan Stewart
*Acting Director of the United States Patent and Trademark Office*